United States Patent
Kouno et al.

(10) Patent No.: US 10,256,212 B2
(45) Date of Patent: Apr. 9, 2019

(54) SEMICONDUCTOR CHIP HAVING MULTIPLE PADS AND SEMICONDUCTOR MODULE INCLUDING THE SAME

(71) Applicant: DENSO CORPORATION, Kariya, Aichi-pref. (JP)

(72) Inventors: Kenji Kouno, Kariya (JP); Hiromitsu Tanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/570,876

(22) PCT Filed: May 27, 2016

(86) PCT No.: PCT/JP2016/002581
§ 371 (c)(1),
(2) Date: Oct. 31, 2017

(87) PCT Pub. No.: WO2016/208122
PCT Pub. Date: Dec. 29, 2016

(65) Prior Publication Data
US 2018/0294250 A1    Oct. 11, 2018

(30) Foreign Application Priority Data
Jun. 24, 2015 (JP) .................... 2015-126785

(51) Int. Cl.
*H01L 25/065* (2006.01)
*H01L 25/07* (2006.01)
(Continued)

(52) U.S. Cl.
CPC ........ *H01L 25/0655* (2013.01); *H01L 23/367* (2013.01); *H01L 24/06* (2013.01); *H01L 25/07* (2013.01); *H01L 25/18* (2013.01); *H01L 27/0635* (2013.01); *H01L 29/0696* (2013.01); *H01L 29/7397* (2013.01);
(Continued)

(58) Field of Classification Search
CPC ...... H01L 25/0655; H01L 24/06; H01L 24/18
See application file for complete search history.

(56) References Cited

U.S. PATENT DOCUMENTS 7,852,104 B2 * 12/2010 Kim .................... G02F 1/1309
                                                                  324/760.02
2016/0133597 A1    5/2016 Kouno

FOREIGN PATENT DOCUMENTS

| JP | 2003-142689 A | 5/2003 |
| JP | 2004-193476 A | 7/2004 |

(Continued)

*Primary Examiner* — Quoc Hoang
(74) *Attorney, Agent, or Firm* — Posz Law Group, PLC

(57) ABSTRACT

The present disclosure provides a semiconductor chip. The semiconductor chip includes a switching element having a gate electrode, a first pad, and a second pad. The first control pad is electrically connected to the gate electrode and applied with a voltage controlling the switching element to switch on or switch off. The second control pad provides a current path of a control current flowing between the first control pad and the second control pad when the switching element is in a switch-on state. One of the first control pad or the second control pad includes two pad components and a remaining one of the first control pad or the second control pad is disposed between the two pad components of the one of the first control pad or the second control pad.

3 Claims, 7 Drawing Sheets

(51) Int. Cl.
*H01L 25/18* (2006.01)
*H01L 23/367* (2006.01)
*H01L 23/00* (2006.01)
*H01L 27/06* (2006.01)
*H01L 29/06* (2006.01)
*H01L 29/739* (2006.01)
*H02M 7/00* (2006.01)
H01L 29/08 (2006.01)
H01L 29/10 (2006.01)
H02M 7/5387 (2007.01)
H02P 27/06 (2006.01)
H02M 1/32 (2007.01)

(52) U.S. Cl.
CPC .............. *H02M 7/003* (2013.01); *H01L 24/32* (2013.01); *H01L 24/33* (2013.01); *H01L 24/48* (2013.01); *H01L 24/73* (2013.01); *H01L 29/0804* (2013.01); *H01L 29/0821* (2013.01); *H01L 29/1004* (2013.01); *H01L 29/1095* (2013.01); *H01L 2224/04042* (2013.01); *H01L 2224/32245* (2013.01); *H01L 2224/33* (2013.01); *H01L 2224/33181* (2013.01); *H01L 2224/73215* (2013.01); *H01L 2224/73265* (2013.01); *H01L 2924/12036* (2013.01); *H01L 2924/13055* (2013.01); *H01L 2924/14252* (2013.01); *H01L 2924/181* (2013.01); *H02M 7/5387* (2013.01); *H02M 2001/327* (2013.01); *H02P 27/06* (2013.01)

(56) References Cited

FOREIGN PATENT DOCUMENTS

JP  2013-149684 A  8/2013
JP  2014-99444 A  5/2014

\* cited by examiner

SEMICONDUCTOR CHIP HAVING MULTIPLE PADS AND SEMICONDUCTOR MODULE INCLUDING THE SAME

CROSS REFERENCE TO RELATED APPLICATIONS

This application is a U.S. national stage of International Patent Application No. PCT/JP2016/002581 filed on May 27, 2016 and is based on Japanese Patent Application No. 2015-126785 filed on Jun. 24, 2015, the disclosures of which are incorporated herein by reference.

TECHNICAL FIELD

The present disclosure relates to a semiconductor chip having multiple pads to be connected to control terminals, and also relates to a semiconductor module including such a semiconductor chip.

BACKGROUND ART

A semiconductor module having so-called 2-in-1 structure is proposed in, for example, Patent Literature 1 as a semiconductor module forming an inverter. The proposed semiconductor module includes a semiconductor chip having a switching element forming an upper arm and another semiconductor chip having a switching element forming a lower arm. The switching elements of the respective semiconductor chips are connected in series. In the proposed semiconductor module, the respective semiconductor chips have a common configuration and each is provided with an IGBT element.

In each semiconductor chip provided with the IGBT element, an upper heat sink is disposed on an emitter side and a lower heat sink is disposed on a collector side. The switching element of the upper arm and the switching element of the lower arm are electrically connected by connecting the upper heat sink on the upper arm side and the lower heat sink on the lower arm side. The lower heat sink on the upper arm side is connected to a first main terminal (positive-electrode terminal), the lower heat sink on the lower arm side is connected to a second main terminal (output terminal), and the upper heat sink on the lower arm side is connected to a third main terminal (negative-electrode terminal). When viewed from above the upper heat sinks, the first through third main terminals are provided to extend in a same direction with respect to the semiconductor chips. When an interval between the first main terminal and the third main terminal becomes wider, parasitic inductance becomes larger. In order to avoid such an inconvenience, the third main terminal is disposed between the first main terminal and the second main terminal.

Each semiconductor chip also has a gate pad and a Kelvin-emitter pad as control pads controlling the IGBT element provided to the semiconductor chip. The former control pad and the latter control pad are electrically connected to a gate terminal and a Kelvin-emitter terminal, respectively.

In the semiconductor module configured as above, a main current from the first main terminal to the second main terminal and a main current from the second main terminal to the third main terminal are switched by alternately switching ON and OFF the respective switching elements of the upper arm and the lower arm.

PRIOR ART LITERATURE

Patent Literature

Patent Literature 1: JP 2013-149684 A

SUMMARY OF INVENTION

In the semiconductor module (semiconductor chips) configured as above, a magnetic flux is induced according to a main current flowing between the corresponding two main terminals when the IGBT element is switched ON upon application of a predetermined voltage to the gate pad. A control current (induced current) is generated between the gate terminal and the Kelvin-emitter terminal to block the induced magnetic flux. The voltage being applied to the gate pad thus fluctuates.

In the semiconductor module configured as above, the third main terminal is disposed between the first main terminal and the second main terminal. Hence, a direction of the main current flowing from the first main terminal to the second main terminal and a direction of the main current flowing from the second main terminal to the third main terminal are opposite. That is, the control currents generated in the semiconductor chip forming the upper arm and in the semiconductor chip forming the lower arm flow oppositely.

In the semiconductor module configured as above, the semiconductor chip forming the upper arm and the semiconductor chip forming the lower arm have a same configuration. Accordingly, the control current flows from the Kelvin-emitter terminal to the gate terminal in one semiconductor chip whereas the control current flows from the gate terminal to the Kelvin-emitter terminal in the other semiconductor chip. When the control current flows from the gate terminal to the Kelvin-emitter terminal, a voltage applied to the gate pad increases to a switching-ON side of the IGBT element, which may give rise to a malfunction.

In view of the foregoing inconveniences, it is an object of the present disclosure to provide a semiconductor chip capable of restricting a malfunction of a switching element and a semiconductor module including such a semiconductor chip.

According to an aspect of the present disclosure, a semiconductor chip includes a plurality of pads and a switching element having a gate electrode. The plurality of pads include: a first control pad electrically connected to the gate electrode and applied with a voltage controlling the switching element to switch on or switch off; and a second control pad providing a current path of a control current flowing between the first control pad and the second control pad when the switching element is in a switch-on state. One of the first control pad or the second control pad includes two pad components and a remaining one of the first control pad or the second control pad is disposed between the two pad components of the one of the first control pad or the second control pad.

According to the configuration as above, when control terminals are connected to the first control pad and the second control pad, alignment position relation of the control terminals connected to the first control pad and the second control pad can be changed as needed. That is, the control terminals can be connected to the first control pad and the second control pad for the control current to flow from the second control pad to the first control pad. Hence, a malfunction of the switching element triggered by the control current can be restricted.

According to another aspect of the present disclosure, a semiconductor module includes: a first semiconductor chip used as an upper arm and including a switching element having a gate electrode, a first main pad disposed on a main surface of the first semiconductor chip, a plurality of control pads disposed adjacent to each other on the main surface, and a second main pad disposed on a rear surface of the first semiconductor chip; a second semiconductor chip used as a lower arm, the second semiconductor chip includes a switching element having a gate electrode and has a same configuration as the first semiconductor chip, and the second semiconductor chip is disposed adjacent to the first semiconductor chip; a positive-electrode terminal electrically connected to the second main pad of the first semiconductor chip; a negative-electrode terminal electrically connected to the first main pad of the second semiconductor chip; an output terminal electrically connected to the first main pad of the first semiconductor chip and to the second main pad of the second semiconductor chip such that the output terminal has an intermediate potential between the upper arm and the lower arm, and a plurality of control terminals connected to the plurality of control pads. When viewed in a direction normal to the main surfaces of the first semiconductor chip and the second semiconductor chip, the positive-electrode terminal, the negative-electrode terminal, and the output terminal are arranged to extend in a same direction with respect to the first semiconductor chip and the second semiconductor chip, and the negative-electrode terminal is disposed between the positive-electrode terminal and the output terminal. In each of the first semiconductor chip and the second semiconductor chip, the plurality of control pads include: a first control pad electrically connected to the gate electrode and applied with a voltage controlling the switching element to switch on or switch off; and a second control pad providing a current path of a control current flowing between the first control pad and the second control pad when the switching element is in a switch-on state. One of the first control pad and the second control pad includes two pad components and a remaining one of the first control pad or the second control pad is disposed between the two pad components of the one of the first control pad or the second control pad. The plurality of control terminals include a first control terminal connected to the first control pad and a second control terminal connected to the second control pad. In each of the first semiconductor chip and the second semiconductor chip, the first control terminal is electrically connected to the first control pad and the second control terminal is electrically connected to the second control pad, and the control current flows from the second control terminal to the first control terminal.

According to the configuration as above, the first control terminal and the second control terminal are electrically connected, respectively, to the first control pad and the second control pad for the control current to flow from the second control terminal to the first control terminal in both of the first semiconductor chip and the second semiconductor chip. Hence, an increase in potential at the first control pad to a switching-ON side of the switching element due to the control current can be restricted, which can in turn restrict a malfunction of the switching element in both of the first semiconductor chip and the second semiconductor chip.

BRIEF DESCRIPTION OF DRAWINGS

The above and other objects, features and advantages of the present invention will become more apparent from the following detailed description made with reference to the accompanying drawings. In the drawings.

EMBODIMENTS FOR CARRYING OUT INVENTION

Figure 1:
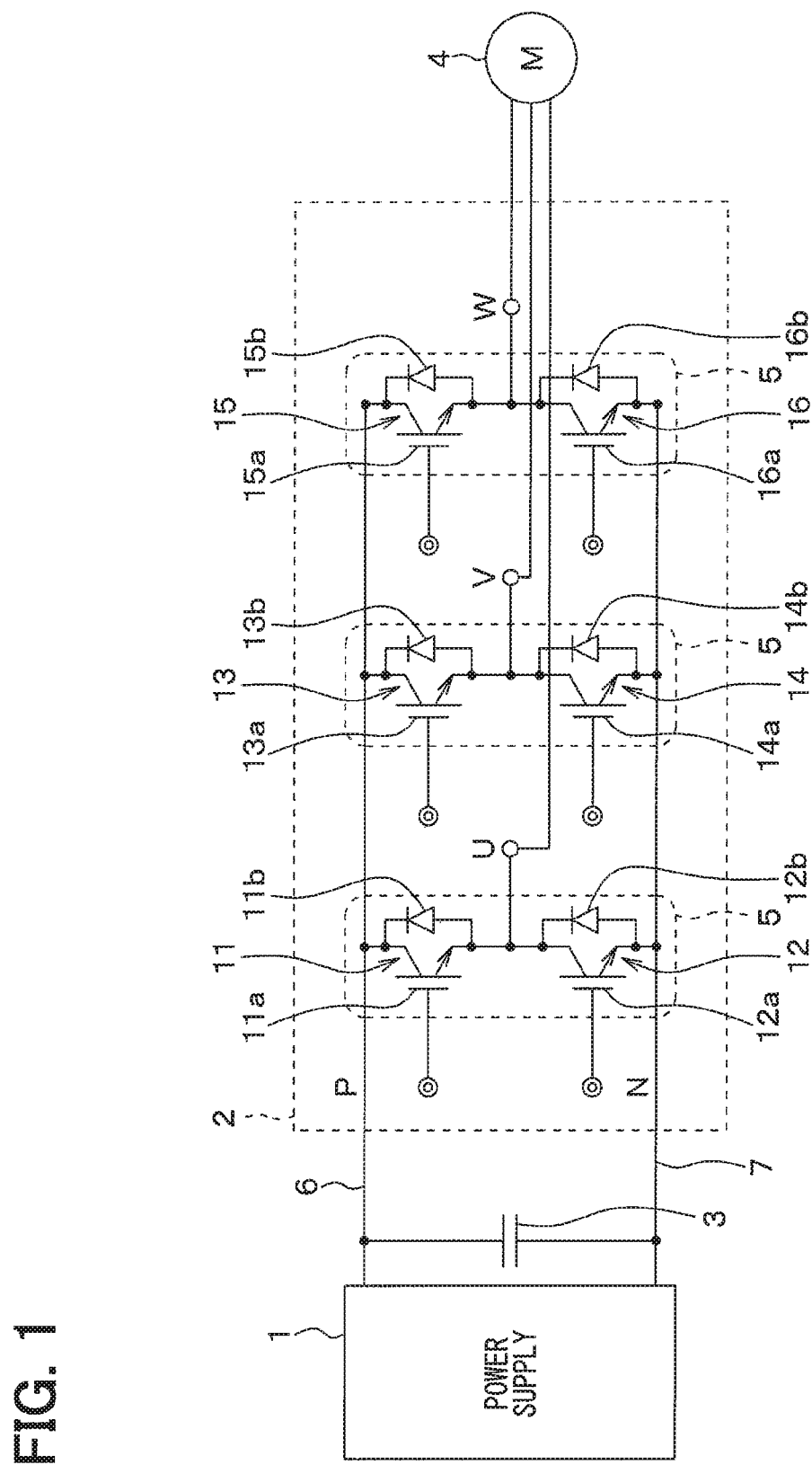
FIG. 1 is a circuit diagram of an inverter in which a semiconductor module of a first embodiment is applied.

Hereinafter, embodiments will be described according to the drawings. In respective embodiments below, a description will be given by labeling same or equivalent portions with same reference numerals.

(First Embodiment)

A first embodiment will be described. The present embodiment will describe an example where a technical idea of the present disclosure is applied to a semiconductor module forming a three-phase motor driving inverter.

A circuit configuration of the inverter will be described first. The inverter AC-drives a three-phase motor 4 as a load according to a DC power supply, and has a power-supply portion 1 including a step-up circuit, an inverter output circuit 2, and a capacitor 3 disposed in parallel between the power-supply portion 1 and the inverter output circuit 2. The capacitor 3 is a smoothing capacitor and provided to form a constant power-supply voltage by reducing a noise influence of the power-supply portion (step-up circuit) 1. The inverter output circuit 2 includes serially-connected upper arms 11, 13, and 15 and lower arms 12, 14, and 16 of three phases which are connected in parallel phase by phase, and applies intermediate potential between the upper arms 11, 13, and 15 and the lower arms 12, 14, and 16 sequentially to a phase U, a phase V, and a phase W of the three-phase motor 4. The upper and lower arms 11 through 16 include IGBT elements 11a through 16a, respectively, and FWD (freewheel diode) elements 11b through 16b, respectively. By switching ON and OFF the IGBT elements 11a through 16a, respectively, of the upper and lower arms 11 through 16 of the respective phases under control, a three-phase AC current in offset cycles is supplied to the three-phase motor 4.

In the present embodiment, a technical idea of the present disclosure is applied to a semiconductor module 5 having a 2-in-1 structure in which every pair of semiconductor chips (IGBT elements 11a through 16a and FWD elements 11b through 16b) forming the upper arms 11, 13, and 15 and the lower arms 12, 14, and 16 in respective layers of the phases U, V, and W in the inverter output circuit 2 are formed into a single package. The inverter output circuit 2 includes three semiconductor modules 5.

A configuration of the semiconductor module 5 of the present embodiment will now be described with reference to FIG. 2 and FIG. 3. The following will describe one semiconductor module 5 forming the phase U of the inverter output circuit 2 by way of example, and it should be appreciated that the other semiconductor modules 5 forming the respective phases V and W are of a same configuration.

Figure 2:
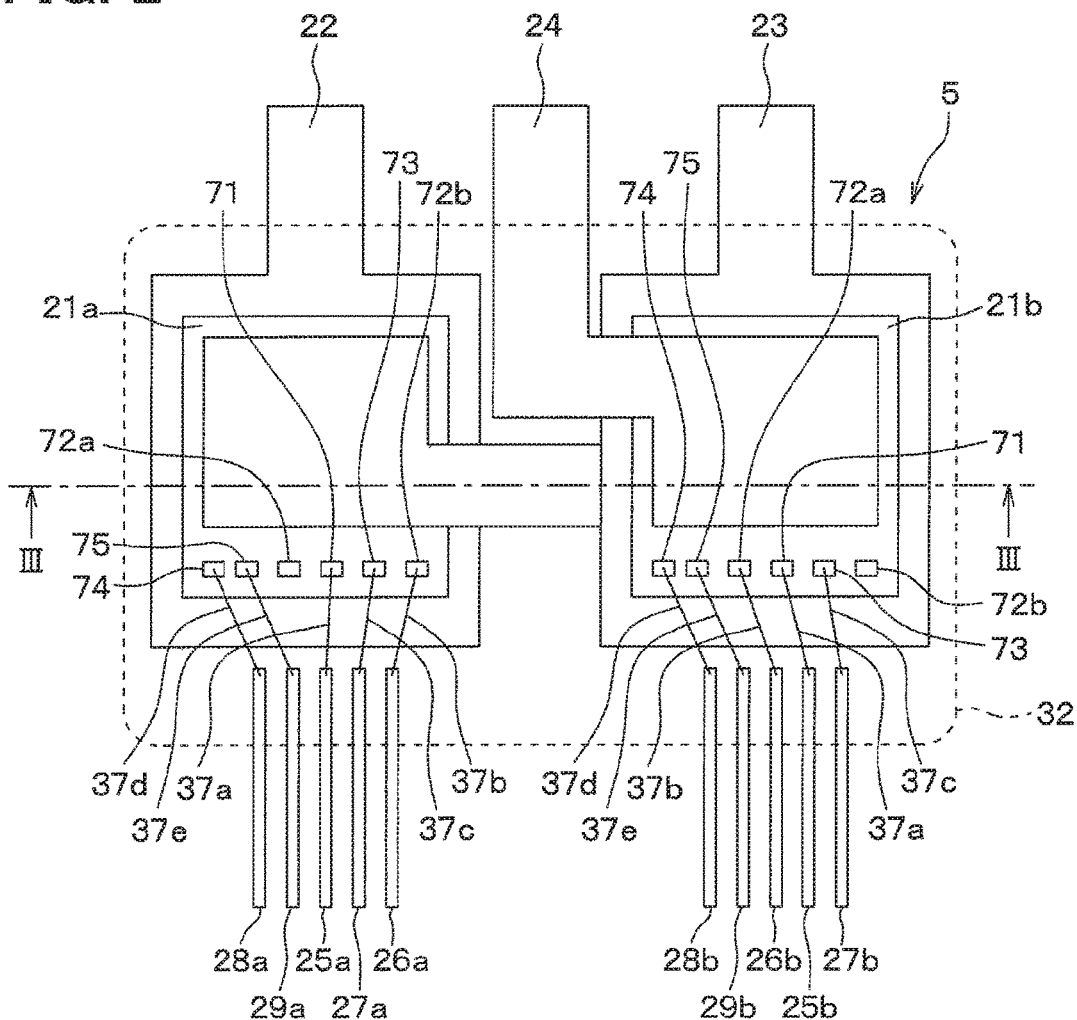
FIG. 2 is a schematic top view of the semiconductor module.
Figure 3:
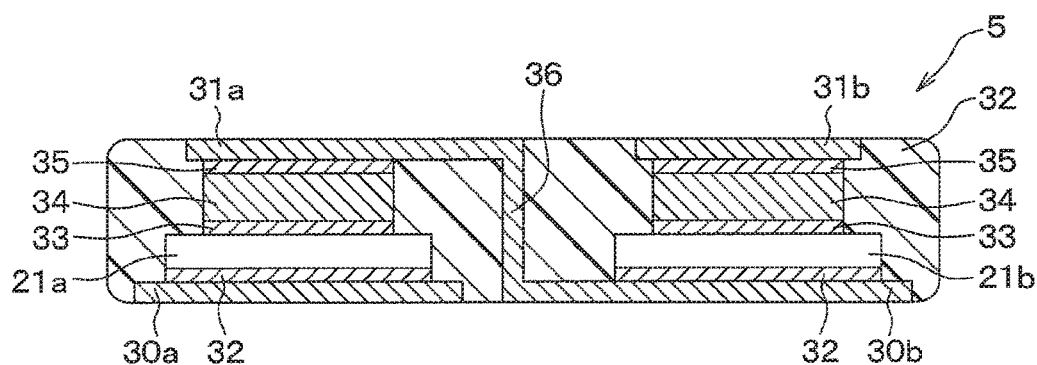
FIG. 3 is a sectional view taken along the line III-III of FIG. 2.

As are shown in FIG. 2 and FIG. 3, the semiconductor module 5 has a structure in which two semiconductor chips 21a and 21b, main terminals 22 through 24, control terminals 25a through 29a and 25b through 29b, lower heat sinks 30a and 30b, upper heat sinks 31a and 31b, and so on are formed into a single unit using mold resin 32. In FIG. 2, the mold resin 32 is indicated by a broken line for easy of understanding of a structure within the mold resin 32.

The semiconductor chip 21a is provided with elements forming the upper arm 11 and the semiconductor chip 21b is provided with elements forming the lower arm 12. The following will describe a specific configuration of the semiconductor chip 21a of the present embodiment with reference to FIG. 4 and FIG. 5. A configuration of the semiconductor chip 21b is same as the configuration the semiconductor chip 21a, and a description is not repeated herein.

Figure 4:
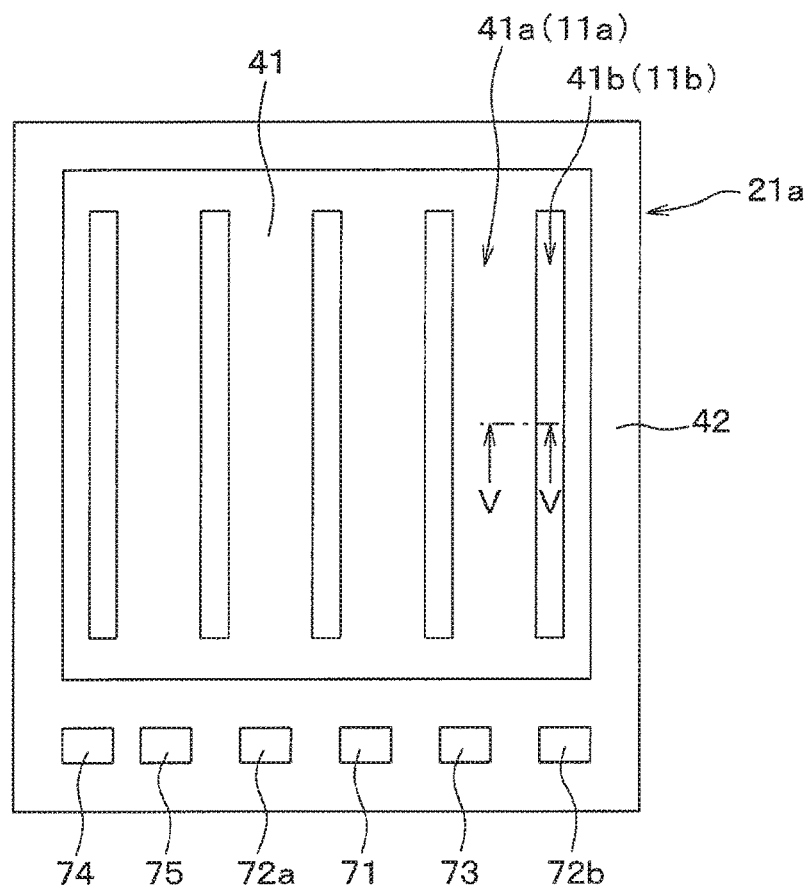
FIG. 4 is a top view of a semiconductor chip.

As is shown in FIG. 4, the semiconductor chip 21a is of a flat rectangular shape and includes a cell region 41 and a peripheral region 42 enclosing the cell region 41.

In the present embodiment, the cell region 41 has an IGBT region 41a where the IGBT element 11a is provided, and an FWD region 41b where the FWD element 11b is provided. In short, the IGBT element 11a and the FWD element 11b are provided to the same chip in the present embodiment. In the present embodiment, the IGBT region 41a and the FWD region 41b are provided to extend along one direction of one surface 50a of a semiconductor substrate 50 (top-bottom direction on a sheet surface of FIG. 4), and provided alternately in a direction perpendicular to an extending direction.

Figure 5:
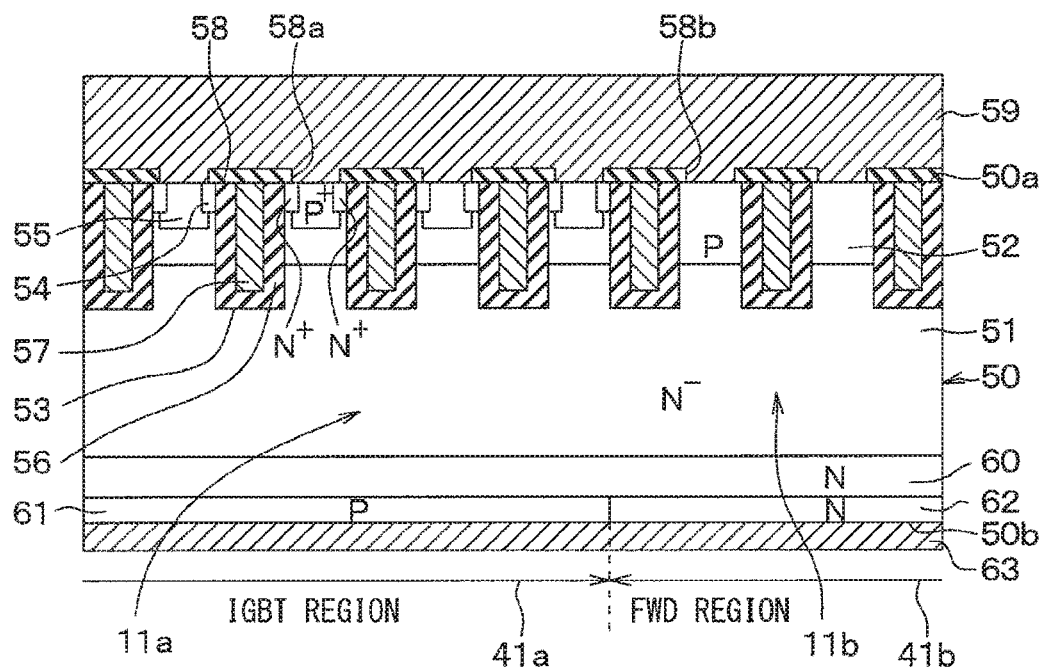
FIG. 5 is a sectional view taken along the line V-V of FIG. 4.

As is shown in FIG. 5, the cell region 41 has the semiconductor substrate 50 which is of an N type and used commonly to function as a drift layer 51. A P type base layer 52 is provided on the drift layer 51 (on a side of the one surface 50a of the semiconductor substrate 50). Multiple trenches 53 are provided to reach the drift layer 51 by penetrating through the base layer 52. The base layer 52 is divided to multiple segments by the trenches 53.

In the present embodiment, more than one trench 53 is provided to each of the IGBT region 41a and the FWD region 41b. The trenches 53 are provided along one direction of plane directions of the one surface 50a of the semiconductor substrate 50 (a face-down direction on a sheet surface of FIG. 5) at regular intervals in a stripe pattern. Tip ends of the multiple trenches 53 may be routed to form a circular structure. The one surface 50a of the semiconductor substrate 50 is a surface provided to the base layer 52 on an opposite side to the drift layer 51.

The base layer 52 functions as a channel region in the IGBT region 41a. The base layer 52 functioning as the channel region (the base layer 52 in the IGBT region 41a) is provided with N$^+$ emitter regions 54 and P$^+$ body regions 55 each sandwiched between two adjacent emitter regions 54.

Each emitter region 54 has higher impurity concentration than the drift layer 51 and is formed to terminate within the base layer 52 and to have contact with a side surface of one trench 53. Meanwhile, each body region 55 has higher impurity concentration than the base layer 52 and is formed to terminate within the base layer 52 as with the emitter region 54.

More specifically, the emitter region 54 is provided to a region between two adjacent trenches 53 and has a structure in which the emitter 54 extends in a rod shape to have contact with a side surface of one trench 53 along a longitudinal direction of the trench 53 and terminates on an inner side than the tip end of the trench 53. The body region 55 is sandwiched between two emitter regions 54 and provided to extend in a rod shape along the longitudinal direction of the trenches 53 (that is, the emitter regions 54). The body region 55 of the present embodiment is formed deeper than the emitter regions 54 in reference to the one surface 50a of the semiconductor substrate 50.

Each trench 53 is filled with a gate insulation film 56 provided to cover a wall surface of the trench 53 and a gate electrode 57 made of polysilicon or the like and provided on the gate insulation film 56. A trench gate structure is thus formed.

An inter-layer insulation film 58 made of BPSG or the like is provided on the base layer 52 (one surface 50a of the semiconductor substrate 50). The inter-layer insulation film 58 is provided with contact holes 58a via which to expose a part of the emitter regions 54 and the body regions 55 in the IGBT region 41a. The inter-layer insulation film 58 is also provided with contact holes 58b via which to expose the base layer 52 in the FWD region 41b.

A top electrode 59 is provided on the inter-layer insulation film 58. The top electrode 59 is electrically connected to the emitter regions 54 and the body regions 55 via the contact holes 58a in the IGBT region 41a, and electrically connected to the base layer 52 via the contact holes 58b in the FWD region 41b. That is, the top electrode 59 functions as an emitter electrode in the IGBT region 41a and functions as an anode electrode in the FWD region 41b. In the present embodiment, the top electrode 59 corresponds to a first main pad.

An N type field stop layer (hereinafter, referred to simply as an FS layer for short) 60 is provided to the drift layer 51 on an opposite side to the base layer 52 (on the side of the other surface 50b of the semiconductor substrate 50). The FS layer 60 is not essentially required. However, the FS layer 60 is provided with an aim of improving performance regarding a breakdown voltage and a steady loss by preventing a depletion layer from spreading and an aim of controlling an amount of holes injected from the side of the other surface 50b of the semiconductor substrate 50.

In the IGBT region 41a, a P type collector layer 61 is provided on an opposite side to the drift layer 51 by sandwiching the FS layer 60. In the FWD region 41b, an N type cathode layer 62 is provided on an opposite side to the drift layer 51 by sandwiching the FS layer 60. That is, the IGBT region 41a and the FWD region 41b are divided depending on whether a layer provided on the side of the other surface 50b of the semiconductor substrate 50 is the collector layer 61 or the cathode layer 62. In other words, in the present embodiment, a portion of the semiconductor substrate 50 above the collector layer 61 is the IGBT region 41a forming the IGBT element 11a whereas a portion above the cathode layer 62 is the FWD region 41b forming the FWD element 11b.

A bottom electrode 63 is provided on the collector layer 61 and the cathode layer 62 (on the other surface 50b of the semiconductor substrate 50). The bottom electrode 63 functions as a collector electrode in the IGBT region 41a and functions as a cathode electrode in the FWD region 41b. In the present embodiment, the bottom electrode 63 corresponds to a second main pad.

Owing to the configuration as above, the FWD element 11b having a PN junction between the base layer 52 as an anode and the drift layer 51, the FS layer 60, and the cathode layer 62 as a cathode is provided in the FWD region 41*b*.

Although an illustration is omitted herein, the peripheral region 42 is provided with a circular P type well region and multiple P type guard rings of a multi-ring structure in a surface-layer portion of the semiconductor substrate 50 to enclose the cell region 41 with an aim of enhancing a breakdown voltage.

As is shown in FIG. 4, the peripheral region 42 is provided with a gate pad 71, first and second Kelvin-emitter pads 72*a* and 72*b*, a current sensing pad 73, and temperature sensing pads 74 and 75. In the present embodiment, the gate pad 71 corresponds to a first control pad and the first and second Kelvin-emitter pads 72*a* and 72*b* correspond to a second control pad.

The gate pad 71 is an external connection pad electrically connected to the gate electrode 57 via an unillustrated gate wiring. The first and second Kelvin-emitter pads 72*a* and 72*b* are external connection pads electrically connected to the emitter regions 54 via an unillustrated Kelvin-emitter wiring. The current sensing pad 73 is an external connection pad electrically connected to the emitter regions 54. The temperature sensing pads 74 and 75 are external connection pads electrically connected to a temperature detection element (not shown) provided on the semiconductor substrate 50.

The pads 71 through 75 are aligned adjacently along one side (one side on a lower side on the sheet surface of FIG. 4) forming an outer shape of the semiconductor chip 21*a*. In the present embodiment, an alignment order from a left side on the sheet surface of FIG. 4 is the temperature sensing pads 74 and 75, the first Kelvin-emitter pad 72*a*, the gate pad 71, the current sensing pad 73, and the second Kelvin-emitter pad 72*b*. In short, the first and second Kelvin-emitter pads 72*a* and 72*b* are disposed to have the gate pad 71 in between.

The above has described the configuration of the semiconductor chip 21*a* of the present embodiment. The semiconductor chip 21*b* is of the same configuration as mentioned above.

As are shown in FIG. 2 and FIG. 3, the semiconductor chips 21*a* and 21*b* are mounted, respectively, on the lower heat sinks 30*a* and 30*b* via solder 32 or the like. Metal blocks 34 are mounted on the respective semiconductor chips 21*a* and 21*b* via solder 33 or the like. The upper heat sinks 31*a* and 31*b* are mounted on the respective metal blocks 34 via solder 35 or the like. Consequently, in the semiconductor chips 21*a* and 21*b*, the bottom electrodes 63 are connected to the respective lower heat sinks 30*a* and 30*b*, and the top electrodes 59 are connected to the respective upper heat sinks 31*a* and 31*b*.

Each of the main terminals 22 through 24 has a flat plate shape, and the main terminals include a positive-electrode terminal 22, an output terminal 23, and a negative-electrode terminal 24. The positive-electrode terminal 22 forms a terminal to be connected to a power-source supply line 6 (see FIG. 1) in the inverter. The positive-electrode terminal 22 is integrally connected to the lower heat sink 30*a* on the side of the upper arm 11 and is thus electrically connected to a rear surface side of the semiconductor chip 21*a*, that is, the bottom electrode 63 of the semiconductor chip 21*a*.

The output terminal 23 forms a terminal to be connected to the three-phase motor 4 between the upper arm 11 and the lower arm 12. The output terminal 23 is integrally connected to the lower heat sink 30*b* on the side of the lower arm 12 and is thus electrically connected to a rear surface side of the semiconductor chip 21*b*, that is, the bottom electrode 63 of the semiconductor chip 21*b*.

The negative-electrode terminal 24 forms a terminal to be connected to a ground line 7 (see FIG. 1) in the inverter. The negative-electrode terminal 24 is integrally connected to the upper heat sink 31*b* of the lower arm 12 and is thus electrically connected to a main surface side of the semiconductor chip 21*b*, that is, the top electrode 59 of the semiconductor chip 21*b*.

The upper heat sink 31*a* and the lower heat sink 30*b* are connected by an intermediate member 36. Consequently, the output terminal 23 has intermediate potential between the upper arm 11 and the lower arm 12.

In the present embodiment, when viewed in a direction normal to plane directions of the semiconductor chips 21*a* and 21*b* (a direction normal to the one surface 50*a* of the semiconductor substrate 50), the positive-electrode terminal 22, the output terminal 23, and the negative-electrode terminal 24 are provided to protrude in a same direction with respect to the semiconductor chips 21*a* and 21*b*. The negative-electrode terminal 24 is located between the positive-electrode terminal 22 and the output terminal 23. In short, the positive-electrode terminal 22 and the negative-electrode terminal 24 are disposed in close proximity to each other. Owing to such a configuration, an increase in parasitic capacity between the power-supply line 6 and the ground line 7 is limited.

The control terminals 25*a* through 29*a* and 25*b* through 29*b* each are of a flat plate shape, and have gate terminals 25*a* and 25*b*, Kelvin-emitter terminals 26*a* and 26*b*, current sensing terminals 27*a* and 27*b*, and temperature sensing terminals 28*a*, 28*b*, 29*a*, and 29*b*, respectively. The control terminals 25*a* through 29*a* and 25*b* through 29*b* are disposed on an opposite side to the main terminals 22 through 24, respectively, with the semiconductor chips 21*a* and 21*b* in between.

The gate terminals 25*a* and 25*b* form terminals to apply a predetermined voltage to the gate electrodes 57 (gate pads 71) and are electrically connected, respectively, to the gate pads 71 provided to the semiconductor chips 21*a* and 21*b* via bonding wires 37*a*. In the present embodiment, the gate terminals 25*a* and 25*b* correspond to a first control terminal.

The Kelvin-emitter terminals 26*a* and 26*b* form terminals functioning as feedback circuits of control currents flowing to the respective gate terminals 25*a* and 25*b*. That is, the Kelvin-emitter terminals 26*a* and 26*b* are terminals which together, respectively, with the gate terminals 25*a* and 25*b* form current paths where the control currents flow when voltages are applied to the gate terminals 25*a* and 25*b*.

In the present embodiment, the Kelvin-emitter terminal 26*a* is connected to the second Kelvin-emitter pad 72*b* via a bonding wire 37*b* on the side of the upper arm 11. Meanwhile, the Kelvin-emitter terminal 26*b* is connected to the first Kelvin-emitter pad 72*a* via the bonding wire 37*b* on the lower arm side 12. That is, the Kelvin-emitter terminals 26*a* and 26*b*, respectively, of the upper arm 11 and the lower arm 12 are connected, respectively, to the Kelvin-emitter pads 72*a* and 72*b* of the corresponding semiconductor chips 21*a* and 21*b* located oppositely in reference to the gate pads 71 of the respective semiconductor chips 21*a* and 21*b*. In other words, an alignment position relation of the gate terminal 25*a* and the Kelvin-emitter terminal 26*a* both connected to the semiconductor chip 21*a* and an alignment position relation of the gate terminal 25*b* and the Kelvin-emitter terminal 26*b* both connected to the semiconductor chip 21*b* are opposite. A reason to connect the Kelvin-emitter terminals 26a and 26b, respectively, to the first and second Kelvin-emitter pads 72a and 72b of the corresponding semiconductor chips 21a and 21b in the manner as above will be described below. In the present embodiment, the Kelvin-emitter terminals 26a and 26b correspond to a second control terminal.

The current sensing terminals 27a and 27b form terminals to measure main currents flowing, respectively, through the semiconductor chips 21a and 21b by extracting a part of the main currents, and are electrically connected to the current sensing pads 73 via bonding wires 37c. The temperature sensing terminals 28a and 28b and the temperature sensing terminals 29a and 29b form terminals to be connected, respectively, to the temperature sensing pads 74 and 75, and are electrically connected, respectively, to the temperature sensing pads 74 and 75 via bonding wires 37d and 37e as needed.

The semiconductor chips 21a and 21b, the main terminals 22 through 24, the control terminals 25a through 29a and 25b through 29b, the lower heat sinks 30a and 30b, the upper heat sinks 31a and 31b, and so on are encapsulated with the mold resin 32 and formed into one unit. More specifically, the semiconductor chips 21a and 21b, the main terminals 22 through 24, the control terminals 25a through 29a and 25b through 29b, the lower heat sinks 30a and 30b, the upper heat sinks 31a and 31b, and so on are encapsulated with the mold resin 32 and formed into one unit in such a manner that the lower heat sinks 30a and 30b and the upper heat sinks 31a and 31b are exposed on opposite sides to the semiconductor chips 21a and 21b, respectively, and the main terminals 22 through 24 and the control terminals 25a through 29a and 25b through 29b are partially exposed. Owing to such a configuration, heat generated in the semiconductor chips 21a and 21b is released from the lower heat sinks 30a and 30b and the upper heat sinks 31a and 31b in portions exposed from the mold resin 32 and the main terminals 22 through 24 and the control terminals 25a through 29a and 25b through 29b are connected to external circuits in portions exposed from the mold resin 32.

The semiconductor module 5 having the 2-in-1 structure of the present embodiment is formed in the manner as described above. An operation of the semiconductor module 5 will now be described with reference to FIG. 6A and FIG. 6B.

In the semiconductor module 5 configured as above, a voltage to switch ON the IGBT elements 11a provided to the respective semiconductor chips 21a and 21b is applied alternately to the gate pad 71 of the semiconductor chip 21a forming the upper arm 11 and the gate pad 71 of the semiconductor chip 21b forming the lower arm 12.

Figure 6A:
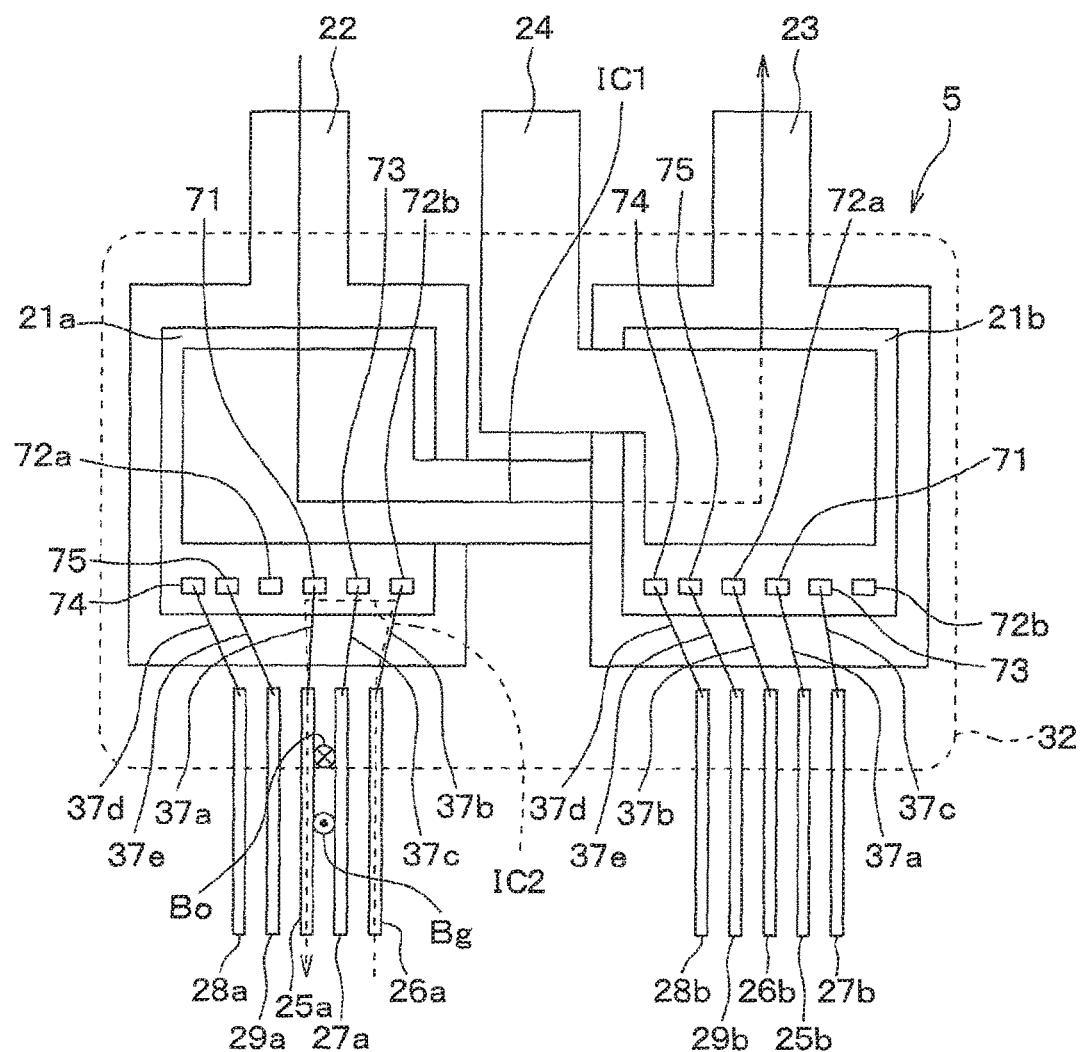
FIG. 6A is a view showing a flow direction of a control current in an upper arm.

When a voltage to switch ON the IGBT element 11a is applied to the gate pad 71 of the semiconductor chip 21a forming the upper arm 11, as is shown in FIG. 6A, a main current IC1 flows from the positive-electrode terminal 22 to the output terminal 23. When the main current IC1 flows, a main magnetic flux Bo passing through the control terminals 25a through 29a from the main surface side to the rear surface side of the semiconductor chip 21a (a face-down direction on a sheet surface of FIG. 6A) is generated according to a right-handed screw rule.

When the main magnetic flux Bo is generated, a control magnetic flux Bg passing from the rear surface side to the main surface side of the semiconductor chip 21a (a face-up direction on the sheet surface of FIG. 6A) is generated. Accordingly, a control current IC2 according to the control magnetic flux Bg flows from the Kelvin-emitter terminal 26a to the gate terminal 25a. That is, because the control current IC2 flows, potential at the gate pad 71 (gate terminal 25a) in the semiconductor chip 21a decreases from a switching-ON side of the IGBT element 11a. Consequently, a malfunction of the IGBT element 11a triggered by an increase in potential at the gate pad 71 of the semiconductor chip 21a can be restricted.

Figure 6B:
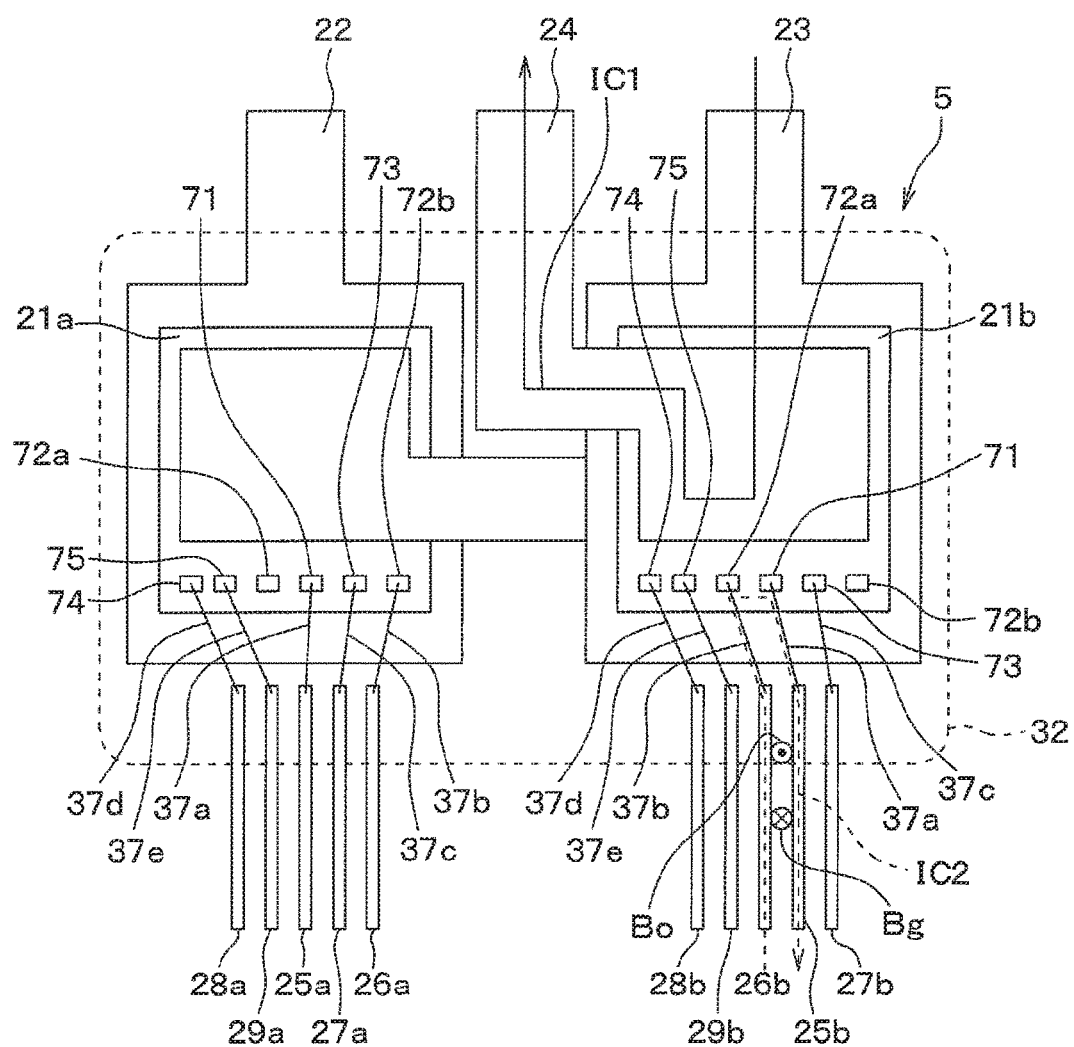
FIG. 6B is a view showing a flow direction of a control current in a lower arm.

Meanwhile, when a voltage to switch ON the IGBT element 12a is applied to the gate pad 71 of the semiconductor chip 21b forming the lower arm 12, as is shown in FIG. 6B, a main current IC1 flows from the output terminal 23 to the negative-electrode terminal 24. When the main current IC1 flows, a main magnetic flux Bo passing through the control terminals 25b through 29b from the rear surface side to the main surface side of the semiconductor chip 21b (a face-up direction on a sheet surface of FIG. 6B) is generated according to the right-handed screw rule.

When the main magnetic flux Bo is generated, a control magnetic flux Bg passing from the main surface side to the rear surface side of the semiconductor chip 21b (a face-down direction on the sheet surface of FIG. 6B) is generated. Accordingly, a control current IC2 according to the control magnetic flux Bg flows from the Kelvin-emitter terminal 26b to the gate terminal 25b. That is, because the control current IC2 flows, potential at the gate pad 71 (gate terminal 25b) of the semiconductor chip 21b decreases from a switching-ON side of the IGBT element 12a. Consequently, a malfunction of the IGBT elements 12a triggered by an increase in potential at the gate pad 71 of the semiconductor chip 21b can be restricted.

That is, in the present embodiment, it can be said that the Kelvin-emitter terminals 26a and 26b are connected, respectively, to one and the other one of the first and second Kelvin-emitter pads 72a and 72b of the corresponding semiconductor chips 21a and 21b for the control current IC2 to flow from the Kelvin-emitter terminals 26a and 26b to the gate terminals 25a and 25b, respectively.

As has been described, in the present embodiment, each of the semiconductor chips 21a and 21b has the first and second Kelvin-emitter pads 72a and 72b with the gate pad 71 in between. Hence, the Kelvin-emitter terminals 26a and 26b can be connected, respectively, to one and the other one of the first and second Kelvin-emitter pad 72a and 72b of the corresponding semiconductor chips 21a and 21b. That is, when the semiconductor module 5 is configured in the manner as above, the Kelvin-emitter terminals 26a and 26b can be connected, respectively, to one and the other one of the Kelvin-emitter pads 72a and 72b of the corresponding upper arm 11 and lower arm 12 for the control currents IC2 generated in the upper arm 11 and the lower arm 12 to flow from the Kelvin-emitter terminal 26a and 26b to the gate terminals 25a and 25b, respectively. Hence, in the upper arm 11 and the lower arm 12, an increase in potential at the gate terminals 25a and 25b (gate pads 71) to a switching-ON side of the IGBT elements 11a and 12a due to the control current IC2 can be limited, which can in turn restrict a malfunction of the IGBT elements 11a and 12a.

(Second Embodiment)

A second embodiment will now be described. The present embodiment is different from the first embodiment above in that each of semiconductor chips 21a and 21b is provided with a single Kelvin-emitter pad 72 and two gate pads 71 disposed to have the Kelvin-emitter pad 72 in between. A rest of the configuration is same as the configuration of the first embodiment above and a description is not repeated herein.

Figure 7:
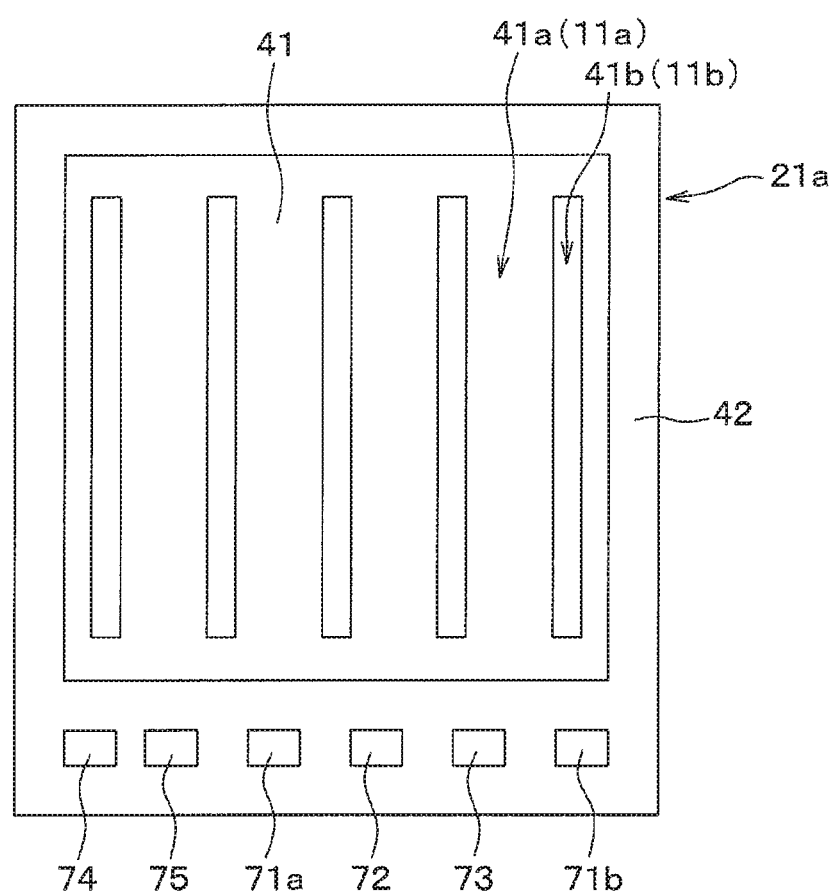
FIG. 7 is a top view of a semiconductor chip of a second embodiment.

As is shown in FIG. 7, in the present embodiment, the semiconductor chip 21a is provided with the single Kelvin-emitter pad 72 alone. The semiconductor chip 21a is also provided with first and second gage pads 71a and 72b to have the Kelvin-emitter pad 72 in between. A configuration of the semiconductor chip 21b is same as the configuration of the semiconductor chip 21a.

Even when the semiconductor chips 21a and 21b are configured as above, by connecting gate terminals 25a and 25b, respectively, to one and the other one of the first and second gate pad 71a and 71b of the corresponding semiconductor chips 21a and 21b when the semiconductor module 5 of the first embodiment above is formed, control currents IC2 flow from Kelvin-emitter terminals 26a and 26b to the gate terminals 25a and 25b, respectively. Hence, an effect same as the effect of the first embodiment above can be obtained.

(Third Embodiment)

A third embodiment will now be described. The present embodiment is different from the first embodiment above in that IGBT elements 11a and 12a and FWD elements 11b and 12b are provided to different chips. A rest of the configuration is same as the configuration of the first embodiment above and a description is not repeated herein.

Figure 8:
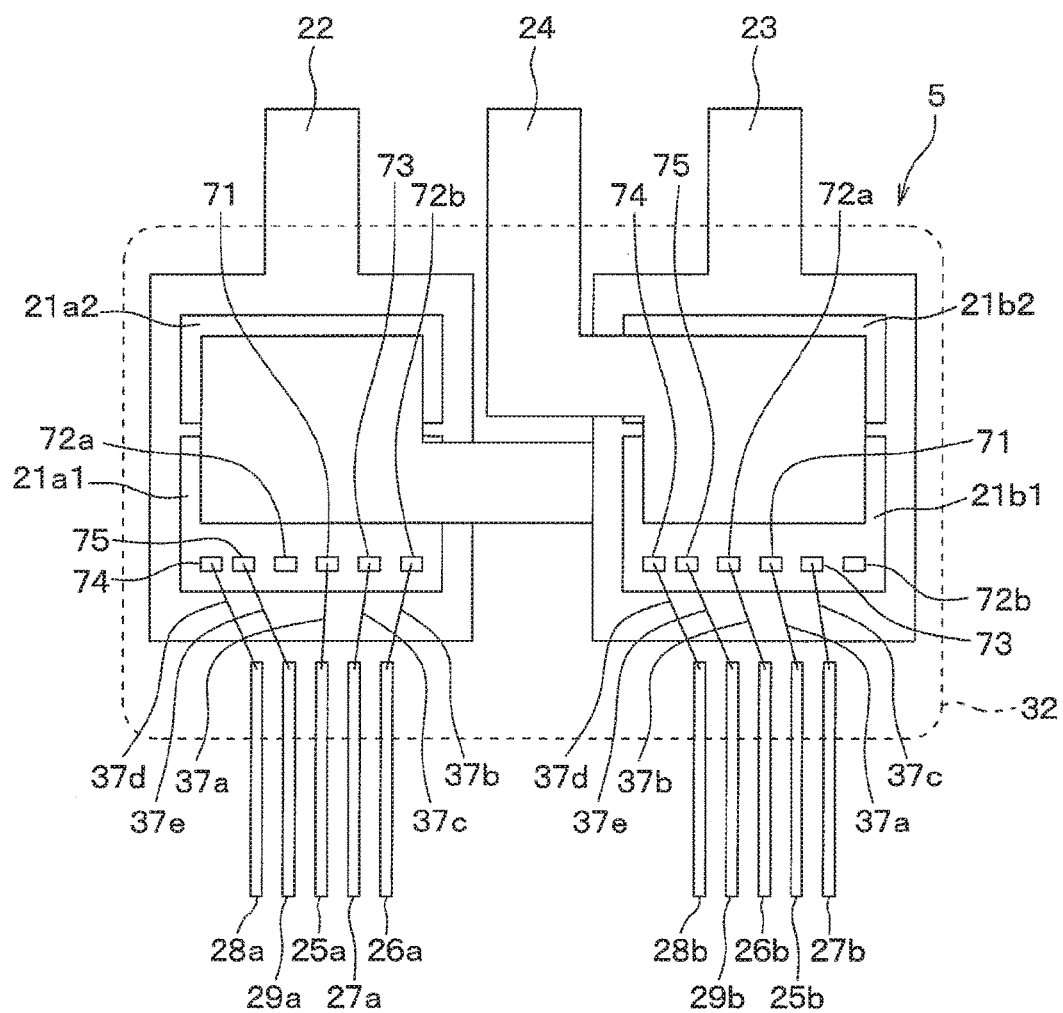
FIG. 8 is a top view of a semiconductor module of a third embodiment.

As is shown in FIG. 8, in the present embodiment, the IGBT element 11a is provided to a semiconductor chip 21a1 whereas the FWD element 11b is provided to a semiconductor chip 21a2 on a side of an upper arm 11. In short, the IGBT element 11a and the FWD element 11b are provided to different semiconductor chips.

Likewise, the IGBT element 12a is provided to a semiconductor chip 21b1 whereas the FWD element 12b is provided to a semiconductor chip 21b2 on a side of a lower arm 12, As in the first embodiment above, each of the semiconductor chips 21a1 and 21b1 is provided with a gate pad 71, first and second Kelvin-emitter pads 72a and 72b, a current sensing pad 73, and temperature sensing pads 74 and 75.

Even when a semiconductor module 5 includes the IGBT elements 11a and 12a and the FWD elements 11b and 12b provided to different chips as described above, an effect same as the first embodiment above can be obtained.

(Other Embodiments)

It should be appreciated that embodiments are not limited to the embodiments described above. The following will describe other embodiments by way of example.

For example, the respective embodiments above have described the semiconductor module 5 having the 2-in-1 structure in which each pair of the semiconductor chips 21a and 21b forming the upper arm 11, 13, or 15 and the lower arm 12, 14, or 16 of one phase are formed in one module. However, the semiconductor module 5 is not limited to the configuration as above. For example, a semiconductor module 5 may have a 6-in-1 structure in which semiconductor chips 21a and 21b forming the upper arms 11, 13, and 15 and the lower arms 12, 14, and 16 of respective phases are all formed into a single unit with mold resin 32 or a semiconductor module 5 may have a 4-in-1 structure in which semiconductor chips 21a and 21b forming a bridge circuit of two phases are formed into a single unit with mold resin 32.

The respective embodiments above have described an example where the semiconductor chips 21a and 21b are provided with the IGBT elements 11a through 16a. However, the semiconductor chips 21a and 21b may be provided with MOS elements having no collector layers 61.

In the first and third embodiments, the gate pad 71 and the current sensing pad 73 are provided between the first and second Kelvin-emitter pads 72a and 72b. However, locations of the current sensing pad 73 and the first and second temperature sensing pads 74 and 75 can be changed as needed as long as the gate pad 71 is provided between the first and second Kelvin-emitter pads 72a and 72b. In the second embodiment, too, locations of the current sensing pad 73 and the first and second temperature sensing pads 74 and 75 can be changed as needed as long as the Kelvin-emitter pad 72 is provided between the first and second gate pads 71a and 71b.

In the first and second embodiments above, the FWD elements 11b through 16b may be omitted.

The invention claimed is:

1. A semiconductor chip comprising:
   a plurality of pads; and
   a switching element having a gate electrode,
   wherein
   the plurality of pads include:
      a first control pad electrically connected to the gate electrode and applied with a voltage controlling the switching element to switch on or switch off; and
      a second control pad providing a current path of a control current flowing between the first control pad and the second control pad when the switching element is in a switch-on state,
   one of the first control pad or the second control pad includes two pad components and a remaining one of the first control pad or the second control pad is disposed between the two pad components of the one of the first control pad or the second control pad, and
   the two pad components of the one of the first control pad or the second control pad and the remaining one of the first control pad or the second control pad are electrically connected to the same switching element.

2. A semiconductor module comprising:
   a first semiconductor chip used as an upper arm, wherein the first semiconductor chip includes:
   a switching element having a gate electrode;
   a first main pad disposed on a main surface of the first semiconductor chip;
   a plurality of control pads disposed adjacent to each other on the main surface; and
   a second main pad disposed on a rear surface of the first semiconductor chip;
   a second semiconductor chip used as a lower arm, wherein the second semiconductor chip includes a switching element having a gate electrode and has a same configuration as the first semiconductor chip, and the second semiconductor chip is disposed adjacent to the first semiconductor chip;
   a positive-electrode terminal electrically connected to the second main pad of the first semiconductor chip;
   a negative-electrode terminal electrically connected to the first main pad of the second semiconductor chip;
   an output terminal electrically connected to the first main pad of the first semiconductor chip and to the second main pad of the second semiconductor chip such that the output terminal has an intermediate potential between the upper arm and the lower arm; and
   a plurality of control terminals connected to the plurality of control pads,
   wherein:
   when viewed in a direction normal to the main surfaces of the first semiconductor chip and the second semiconductor chip, the positive-electrode terminal, the negative-electrode terminal, and the output terminal are arranged to extend in a same direction with respect to the first semiconductor chip and the second semiconductor chip, and the negative-electrode terminal is disposed between the positive-electrode terminal and the output terminal;

in each of the first semiconductor chip and the second semiconductor chip, the plurality of control pads include:

a first control pad electrically connected to the gate electrode and applied with a voltage controlling the switching element to switch on or switch off; and a second control pad providing a current path of a control current flowing between the first control pad and the second control pad when the switching element is in a switch-on state, wherein one of the first control pad and the second control pad includes two pad components and a remaining one of the first control pad or the second control pad is disposed between the two pad components of the one of the first control pad or the second control pad, and the plurality of control terminals include a first control terminal connected to the first control pad and a second control terminal connected to the second control pad; and in each of the first semiconductor chip and the second semiconductor chip, the first control terminal is electrically connected to the first control pad and the second control terminal is electrically connected to the second control pad, and the control current flows from the second control terminal to the first control terminal.

3. The semiconductor module according to claim 2, wherein:

an alignment position relation of the first control terminal and the second control terminal, which are connected to the first semiconductor chip, is opposite to an alignment position relation of the first control terminal and the second control terminal, which are connected to the second semiconductor chip.

\* \* \* \* \*